United States Patent
Ota et al.

(10) Patent No.: US 8,618,578 B2
(45) Date of Patent: Dec. 31, 2013

(54) FIELD EFFECT TRANSISTOR

(75) Inventors: Kazuki Ota, Tokyo (JP); Yasuhiro Okamoto, Tokyo (JP); Hironobu Miyamoto, Tokyo (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 220 days.

(21) Appl. No.: 13/147,676

(22) PCT Filed: Feb. 3, 2010

(86) PCT No.: PCT/JP2010/000651
§ 371 (c)(1),
(2), (4) Date: Aug. 3, 2011

(87) PCT Pub. No.: WO2010/092768
PCT Pub. Date: Aug. 19, 2010

(65) Prior Publication Data
US 2011/0291160 A1    Dec. 1, 2011

(30) Foreign Application Priority Data
Feb. 16, 2009    (JP) .................. 2009-032715

(51) Int. Cl.
*H01L 29/66* (2006.01)
(52) U.S. Cl.
USPC .......................... 257/192; 257/615; 438/172
(58) Field of Classification Search
None
See application file for complete search history.

(56) References Cited

U.S. PATENT DOCUMENTS

| | | | | |
|---|---|---|---|---|
| 6,166,404 A | * | 12/2000 | Imoto et al. | 257/279 |
| 7,199,408 B2 | * | 4/2007 | Miyoshi | 257/194 |
| 8,198,652 B2 | * | 6/2012 | Ando et al. | 257/192 |
| 2008/0093626 A1 | * | 4/2008 | Kuraguchi | 257/190 |

FOREIGN PATENT DOCUMENTS

| | | |
|---|---|---|
| JP | 2001085670 A | 3/2001 |
| JP | 2006032911 A | 2/2006 |
| JP | 2008103617 A | 5/2006 |
| JP | 2007067240 A | 3/2007 |
| WO | 2007077666 A | 7/2007 |

OTHER PUBLICATIONS

International Search Report for PCT/JP2010/00065 mailed Apr. 20, 2010.

* cited by examiner

*Primary Examiner* — Andres Munoz
(74) *Attorney, Agent, or Firm* — McGinn IP Law Group, PLLC

(57) ABSTRACT

A field effect transistor includes a nitride-based semiconductor multi-layer structure, a source electrode (108), a drain electrode (109), a protective film (110), and a gate electrode (112) that is provided in a recess structure, which is formed by etching, directly or with a gate insulating film interposed therebetween. The nitride-based semiconductor multi-layer structure includes at least a base layer (103) made of $Al_XGa_{1-X}N$ ($0 \leq 1$), a channel layer (104) made of GaN or InGaN, a first electron supply layer (105), which is an undoped or n-type $Al_YGa_{1-Y}N$ layer, a threshold value control layer (106), which is an undoped $Al_ZGa_{1-Z}N$ layer, and a second electron supply layer (107), which is an undoped or n-type $Al_WGa_{1-W}N$ layer, epitaxially grown in this order on a substrate (101) with a buffer layer (102) interposed therebetween. The Al composition of each layer in the nitride-based semiconductor multi-layer structure satisfies $0<X \leq Y \leq 1$ and $0<Z \leq Y \leq 1$.

10 Claims, 13 Drawing Sheets

FIELD EFFECT TRANSISTOR

TECHNICAL FIELD

The present invention relates to a field effect transistor using a nitride-based semiconductor.

BACKGROUND ART

A nitride-based semiconductor, such as GaN, AlGaN, InGaN, InAlN, or InAlGaN, has high dielectric breakdown strength, high thermal conductivity, and a high saturated electron velocity. Therefore, the nitride-based semiconductor is preferable as a semiconductor material used to manufacture a power device for power control, such as a high frequency device or a switching element. In recent years, a technique for putting a field effect transistor using a nitride-based semiconductor material into practical use has been actively developed.

It is preferable that the field effect transistor using the nitride-based semiconductor as a semiconductor material be a normally-off (enhancement) type which does not require a negative DC bias power supply for supplying power to the gate electrode of the field effect transistor. For example, a normally-off (enhancement) field effect transistor using a nitride-based semiconductor material shown in FIG. 12 has been proposed (for example, Patent Document 1).

FIG. 12 shows the structure of the normally-off (enhancement) field effect transistor using the nitride-based semiconductor material which is disclosed in Patent Document 1. Next, the normally-off field effect transistor using the nitride-based semiconductor disclosed in Patent Document 1 will be described with reference to FIG. 12.

The field effect transistor shown in FIG. 12 has a structure in which a carrier travel layer 1 made of $Al_XGa_{1-X}N$ ($0 \leq X < 1$), which is an undoped nitride semiconductor, a barrier layer 2 made of $Al_YGa_{1-Y}N$ ($0 < Y \leq 1$ and $X < Y$), which is an undoped or n-type nitride-based semiconductor having a lattice constant smaller than that of the carrier travel layer 1, a threshold value control layer 3 that is made of an undoped or n-type semiconductor having the same lattice constant as that of the carrier travel layer 1, and a carrier inducing layer 4 made of $In_WAl_ZGa_{1-W-Z}N$ ($0 < W \leq 1$ and $0 < Z < 1$) are sequentially laminated. In addition, a recess structure 30 in which the entire carrier inducing layer 4 and a portion of the threshold value control layer 3 are removed is formed at a position where the gate electrode 5 is formed. Then, a gate electrode 5 is formed so as to cover the recess structure 30. A source electrode 6 and a drain electrode 7 are substantially symmetrically formed on the carrier inducing layer 4 with the gate electrode 5 interposed therebetween.

In Patent Document 1, in the field effect transistor shown in FIG. 12, the barrier layer 2 is formed to have a thickness d1 represented by the following Expression 1, thereby achieving a normally-off field effect transistor:

$$d1 \leq 16.4 \times (1 - 1.27 \times (Y-X))/(Y-X) [\text{Å}]$$ [Expression 1]

(where $Y-X < 1/1.27$ is satisfied).

In Patent Document 1, in the transistor shown in FIG. 12, the gate electrode 5 is formed in the recess structure 30 having a bottom in the threshold value control layer 3. However, since the threshold value control layer 3 is made of a semiconductor material having the same lattice constant as that of the carrier travel layer 1, the threshold voltage (Vt) of the transistor does not vary depending on the thickness of the threshold value control layer 3. That is, even when there is a variation in etching depth during the formation of the recess structure 30, it is possible to reduce a variation in the threshold voltage of the transistor since the threshold voltage does not vary.

RELATED DOCUMENT

[Patent Document 1] Japanese Unexamined Patent Publication No. 2008-103617

DISCLOSURE OF THE INVENTION

Problem to be Solved by the Invention

However, the normally-off (enhancement) field effect transistor disclosed in Patent Document 1 has the following problems.

In the normally-off field effect transistor shown in FIG. 12, in regions other than the region in which the gate electrode 5 is formed, two-dimensional electron gases serving as carriers are stored in both the carrier travel layer 1 and the threshold value control layer 3. However, there is a high connection resistance between the two-dimensional electron gases stored in the carrier travel layer 1 and the threshold value control layer 3. Therefore, in the field effect transistor disclosed in Patent Document 1, it is difficult to reduce the on-resistance of the field effect transistor.

Next, the reason why it is difficult to reduce the on-resistance of the field effect transistor in the field effect transistor disclosed in Patent Document 1 will be described with reference to FIG. 13. FIG. 13 is a diagram schematically illustrating the energy state of a conduction band in the depth direction at the position where the source electrode 6/the drain electrode 7 are formed in FIG. 12, which is disclosed in Patent Document 1.

In regions other than the region in which the gate electrode 5 is formed, the carrier inducing layer 4 made of $In_WAl_ZGa_{1-W-Z}N$ ($0 < W \leq 1$ and $0 < Z < 1$) is formed on the surface. In this way, as shown in FIG. 13, the energy of the conduction band is less than the Fermi level in a portion of the threshold value control layer 3 in addition to a portion of the carrier travel layer 1. The two-dimensional electron gas is stored at the position where the energy of the conduction band is less than the Fermi level. Therefore, in this region, the two-dimensional electron gas serving as a carrier is stored in both the carrier travel layer 1 and the threshold value control layer 3.

A path is considered through which an electron serving as a carrier which takes charge of a current flows between the source electrode 6 and the drain electrode 7 when a positive bias voltage higher than the threshold voltage (Vt) is applied to the gate electrode 5 of the field effect transistor shown in FIG. 12 to turn on the transistor. First, the electron serving as a carrier is implanted from the source electrode 6 to the two-dimensional electron gas in the threshold value control layer 3. In the region in which the gate electrode 5 is formed, since only the carrier travel layer 1 forms the two-dimensional electron gas, the electron implanted into the two-dimensional electron gas in the threshold value control layer 3 needs to be implanted from the two-dimensional electron gas in the threshold value control layer 3 to the two-dimensional electron gas in the carrier travel layer 1. Then, the electron that is moved below the gate electrode 5 by the two-dimensional electron gas in the carrier travel layer 1 is sequentially implanted into the carrier travel layer 1, the threshold value control layer 3, and the drain electrode 7. In this way, the electron takes charge of a current.

As such, when the path through which the electron flows is considered, it is necessary to reduce the contact resistance between the source electrode 6 and the drain electrode 7, that is, the connection resistance to the two-dimensional electron gas in the threshold value control layer 3 in order to obtain a low on-resistance in the field effect transistor shown in FIG. 12. In addition, it is necessary to reduce the connection resistance between the two-dimensional electron gas in the threshold value control layer 3 and the two-dimensional electron gas in the carrier travel layer 1.

As a method of reducing the connection resistance to the two-dimensional electron gas in the threshold value control layer 3, a technique has been known in which the source electrode 6 and the drain electrode 7 are made of TiAl and a heat treatment is performed at a temperature of about 600° C. to obtain a relatively low contact resistance of about $10^{-5}$ $\Omega cm^2$.

In order to reduce the connection resistance between the two-dimensional electron gas in the threshold value control layer 3 and the two-dimensional electron gas in the carrier travel layer 1, a computer simulation is used to estimate the connection resistance. A connection resistance simulation method will be described below.

First, in a region between the source electrode 6 (or the drain electrode 7) and the gate electrode 5 in the field effect transistor shown in FIG. 12, a conduction band energy distribution and an electron density distribution in the cross section in a direction vertical to the surface of a wafer are calculated considering the quantum effect. Then, the calculation result is used to calculate the connection resistance between the threshold value control layer 3 and the carrier travel layer 1, considering a quantum-mechanical tunnel current and a thermionic emission current. As a result, for example, when the Al composition X of the carrier travel layer 1 and the threshold value control layer 3 made of $Al_XGa_{1-X}N$ ($0 \leq X \leq 1$) is 0 and the Al composition Y of the barrier layer 2 made of $Al_YGa_{1-Y}N$ ($0 < Y \leq 1$ and $X < Y$) is 0.15, that is, $Y-X=0.15$ is established, the connection resistance between the two-dimensional electron gas in the threshold value control layer 3 and the two-dimensional electron gas in the carrier travel layer 1 is a very large value of $10^0$ $\Omega cm^2$.

As described above, in the field effect transistor disclosed in Patent Document 1, the connection resistance between the two-dimensional electron gas in the threshold value control layer 3 and the two-dimensional electron gas in the carrier travel layer 1 is five orders of magnitude more than the contact resistance between the source electrode 6 and the drain electrode 7. Therefore, in the field effect transistor disclosed in Patent Document 1, it is difficult to achieve a field effect transistor with a low on-resistance.

In Patent Document 1, the material forming the carrier inducing layer 4 is changed from AlGaN to InAlN to increase the two-dimensional electron gas stored in the threshold value control layer 3 and the carrier travel layer 1, thereby reducing the on-resistance of the field effect transistor. However, as shown in FIG. 13, the connection resistance between the two-dimensional electron gas in the threshold value control layer 3 and the two-dimensional electron gas in the carrier travel layer 1 is determined by an energy barrier generated at the interface between the threshold value control layer 3 and the barrier layer 2. That is, in the structure disclosed in Patent Document 1, the connection resistance increases because the energy barrier at the interface increases due to an increase in the amount of negative polarized charge generated at the interface between the threshold value control layer 3 and the barrier layer 2 and an increase in the discontinuous quantity ($\Delta Ec$) of the conduction band at the interface. That is, even when the material forming the carrier inducing layer 4 is changed from AlGaN to InAlN, it is difficult to reduce the energy barrier generated at the interface between the threshold value control layer 3 and the barrier layer 2. Therefore, it is difficult to reduce the connection resistance between the two-dimensional electron gas in the threshold value control layer 3 and the two-dimensional electron gas in the carrier travel layer 1. For this reason, in the method disclosed in Patent Document 1 in which the carrier inducing layer 4 is made of InAlN, it is difficult to effectively reduce the on-resistance of the field effect transistor.

The invention has been made in view of the above-mentioned problems, and an object of the invention is to provide a technique capable of reducing the on-resistance of a field effect transistor using a nitride semiconductor, for example, a normally-off (enhancement) field effect transistor.

Means for Solving Problem

In one embodiment, there is provided a field effect transistor including: a nitride-based semiconductor multi-layer structure; a source electrode; a drain electrode; a protective film; and a gate electrode. The nitride-based semiconductor multi-layer structure includes at least a base layer made of $Al_XGa_{1-X}N$ ($0 < X \leq 1$), a channel layer made of GaN or InGaN, a first electron supply layer, which is an undoped or n-type $Al_YGa_{1-Y}N$ layer, a threshold value control layer, which is an undoped $Al_ZGa_{1-Z}N$ layer, and a second electron supply layer, which is an undoped or n-type $Al_WGa_{1-W}N$ layer, epitaxially grown in this order over a substrate with a buffer layer interposed therebetween. The source electrode, the drain electrode, and the protective film are provided over a surface of the nitride-based semiconductor multi-layer structure. The gate electrode is provided in a recess structure, which is formed by etching the entire protective film, the entire second electron supply layer, and a portion of the threshold value control layer in a portion of a space between the source electrode and the drain electrode, directly or with a gate insulating film interposed therebetween. The Al composition of each layer in the nitride-based semiconductor multi-layer structure satisfies $0 < X \leq Y \leq 1$ and $0 < Z \leq Y \leq 1$.

Advantages of the Invention

According to the above-mentioned embodiment of the invention, it is possible to reduce the on-resistance of a field effect transistor using a nitride-based semiconductor material.

DESCRIPTION OF EMBODIMENTS

Hereinafter, exemplary embodiments of the invention will be described in detail with reference to the accompanying drawings. The following exemplary embodiments are illustrative, but the invention is not limited thereto.

Figure 1:
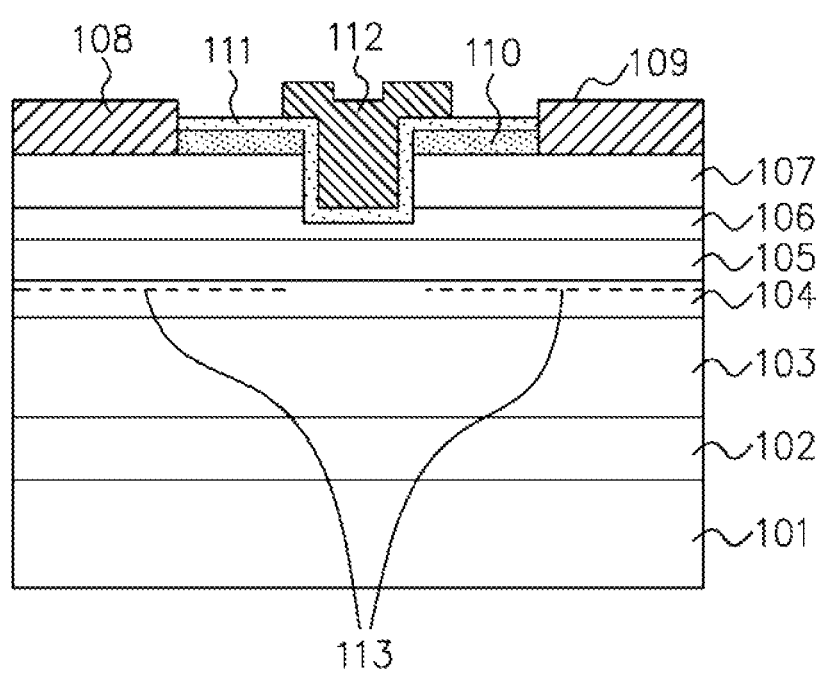
FIG. 1 is a cross-sectional view schematically illustrating an example of the structure of a field effect transistor according to an embodiment.

First, a field effect transistor according to an embodiment will be described in detail with reference to the drawings. FIG. 1 is a diagram schematically illustrating an example of the structure of the field effect transistor according to this embodiment.

As shown in FIG. 1, a nitride semiconductor applied to the field effect transistor according to this embodiment includes a substrate 101, a buffer layer 102, a base layer 103, a channel layer 104, a first electron supply layer 105, a threshold value control layer 106, and a second electron supply layer 107.

The base layer 103 is made of $Al_XGa_{1-X}N$ ($0<X\leq1$) and the channel layer 104 is made of GaN or InGaN. The first electron supply layer 105 is an undoped or n-type $Al_YGa_{1-Y}N$ layer with a thickness equal to or more than 2 nm and equal to or less than 15 nm. The threshold value control layer 106 is an undoped $Al_ZGa_{1-Z}N$ layer with a thickness equal to or more than 2 nm and equal to or less than 15 nm. The second electron supply layer 107 is an undoped or n-type layer. The above-mentioned layers are epitaxially grown in this order on the buffer layer formed on the substrate 101. Therefore, the nitride semiconductor has a laminated structure. The Al composition of each of the above-mentioned layers satisfies $0<X\leq Y\leq1$ and $0<Z\leq Y\leq1$. The Al composition of each layer may satisfy at least one of $Y-X\leq0.1$, $Y-Z\leq0.1$, $Z-X\leq0.1$, and $Y\leq W\leq1$.

The field effect transistor includes a source electrode 108, a drain electrode 109, and a protective film 110 formed on the surface of the second electron supply layer 107 of the nitride semiconductor. The field effect transistor also has a recess structure in which, in a portion of a region between the source electrode 108 and the drain electrode 109, the entire protective film 110, the entire second electron supply layer 107, and a portion of the threshold value control layer 106 are removed by etching. In addition, the field effect transistor includes a gate electrode 112 that is provided in the recess structure directly or with a gate insulating film 111 interposed therebetween.

In this embodiment, the thickness of the first electron supply layer 105 is equal to or more than 2 nm and equal to or less than 15 nm, the thickness of the threshold value control layer 106 is equal to or more than 2 nm and equal to or less than 15 nm, and the Al composition of each layer satisfies $0<X\leq Y\leq1$ and $0<Z\leq Y\leq1$. This is based on a variation in the connection resistance between a two-dimensional electron gas in the threshold value control layer 106 and a two-dimensional electron gas in the channel layer 104 and the rate of change of Vt due to a variation in the Al composition of each layer shown in FIGS. 9 and 11, which will be described below. That is, when the Al composition of each layer satisfies $0<X\leq Y\leq1$ and $0<Z\leq Y\leq1$, it is possible to obtain the above-mentioned effect of the invention and solve the problems of the invention. As the thickness of the first electron supply layer 105 increases, a threshold voltage shifts closer to a negative side. As a result, a normally-on type is obtained. When the thickness of the first electron supply layer 105 is limited to a range of equal to or more than 2 nm and equal to or less than 15 nm and the Al composition of each layer satisfies $0<X\leq Y\leq1$ and $Y-X\leq0.1$, a normally-off type can be obtained. The rate of change of Vt indicates a variation in threshold voltage (Vt) when the thickness of the threshold value control layer 106 is changed by 1 nm in the field effect transistor according to this embodiment.

Two-dimensional electron gases 114 and 113 become carriers and a current flows in a given region of the second electron supply layer 107, which will be described below with reference to FIG. 8. In this case, as W increases, the amount of two-dimensional electron gas increases. Therefore, it is possible to reduce resistance. That is, the Al composition of each layer satisfies $Y\leq W\leq1$ and resistance is reduced.

First Embodiment

A nitride semiconductor applied to a field effect transistor according to this embodiment has the following layer structure. That is, a buffer layer 102, a base layer 103, a channel layer 104, a first electron supply layer 105, a threshold value control layer 106, and a second electron supply layer 107 are epitaxially grown in this order on a substrate 101 to form the nitride semiconductor. The field effect transistor has a source electrode 108, a drain electrode 109, and a protective film 110 formed on the surface of the second electron supply layer 107 of the nitride semiconductor. In addition, the field effect transistor also has a recess structure in which, in a portion of the region between the source electrode 108 and the drain electrode 109, the entire protective film 110, the entire second electron supply layer 107, and a portion of the threshold value control layer 106 are removed by etching. In addition, the field effect transistor includes a gate electrode 112 that is provided in the recess structure directly or with a gate insulating film 111 interposed therebetween.

In the field effect transistor according to this embodiment, the channel layer 104 is an undoped GaN layer with a thickness of 15 nm. The first electron supply layer 105 is an undoped $Al_{0.15}Ga_{0.85}N$ layer with a thickness of 10 nm. The threshold value control layer 106 is an undoped $Al_{0.07}Ga_{0.93}N$ layer with a thickness of 10 nm. The second electron supply layer 107 is an undoped $Al_{0.25}Ga_{0.75}$ layer with a thickness of 25 nm.

That is, in the field effect transistor according to this embodiment, the Al composition X of the base layer 103 made of $Al_XGa_{1-X}N$ is 0.07, the Al composition Y of the first electron supply layer 105 made of $Al_YGa_{1-Y}N$ is 0.15, the Al composition Z of the threshold value control layer 106 made of $Al_ZGa_{1-Z}N$ is 0.07, and the Al composition W of the second electron supply layer 107 made of $Al_WGa_{1-W}N$ is 0.25. The Al composition of each layer satisfies $0<X \leq Y \leq 1$ and $0<Z \leq Y \leq 1$. In addition, the Al composition of each layer also satisfies $Y-X \leq 0.1$, $Y-Z \leq 0.1$, $Z-X \leq 0.1$, and $Y \leq W \leq 1$. In particular, in this embodiment, $X=Z$ is established, that is, the base layer 103 and the threshold value control layer 106 have the same Al composition.

FIGS. 2 to 5 are cross-sectional views schematically illustrating an example of a process of manufacturing the field effect transistor according to this embodiment. Next, an example of a method of manufacturing the field effect transistor according to this embodiment will be described with reference to FIGS. 2 to 5.

Figure 2:
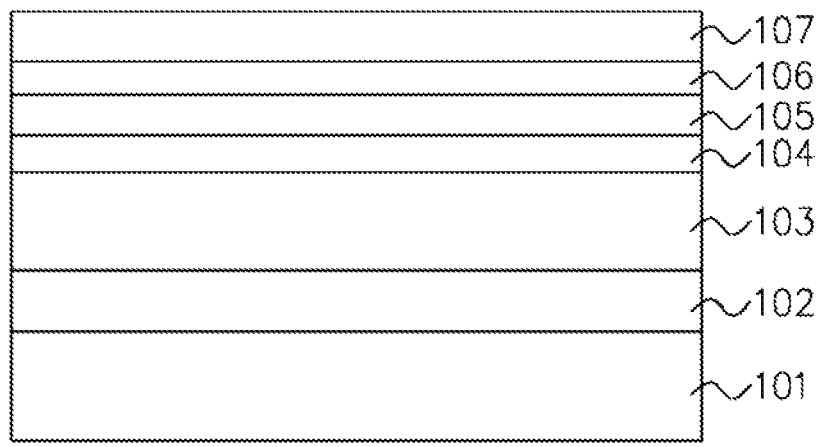
FIG. 2 is a cross-sectional view schematically illustrating an example of an epitaxial growth process in a process of manufacturing the field effect transistor according to this embodiment.

First, as shown in FIG. 2, the buffer layer 102, the base layer 103 which is an undoped $Al_{0.07}Ga_{0.93}N$ layer with a thickness of 1 μm, the channel layer 104, which is an undoped GaN layer with a thickness of 15 nm, the first electron supply layer 105, which is an undoped $Al_{0.15}Ga_{0.85}N$ layer with a thickness of 10 nm, the threshold value control layer 106, which is an undoped $Al_{0.07}Ga_{0.93}N$ layer with a thickness of 10 nm, and the second electron supply layer 107, which is an undoped $Al_{0.25}Ga_{0.75}N$ layer with a thickness of 25 nm, are epitaxially grown in this order on the substrate 101 made of Si by metal organic vapor phase epitaxy (MOVPE). In this way, the laminated structure of the nitride semiconductor applied to manufacture the field effect transistor is obtained.

Figure 3:
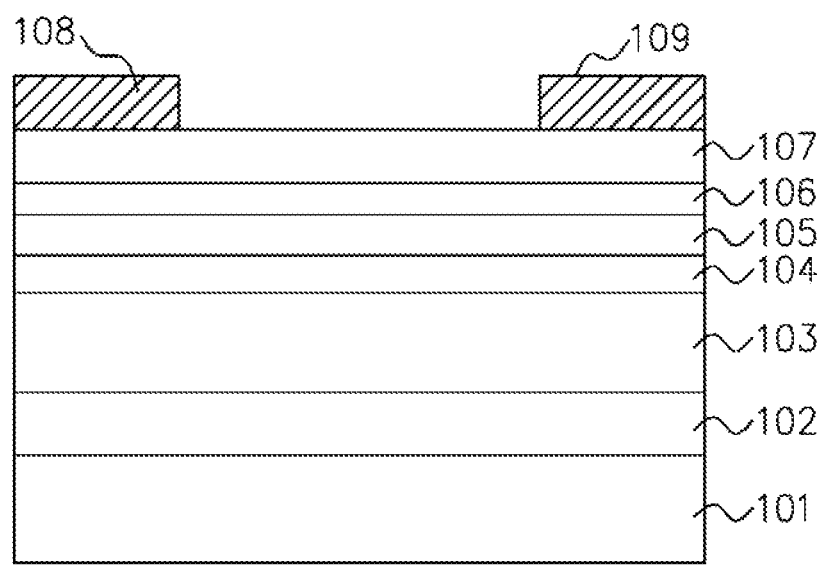
FIG. 3 is a cross-sectional view schematically illustrating an example of a process of forming a source electrode and a drain electrode in the process of manufacturing the field effect transistor according to this embodiment.

Then, as shown in FIG. 3, a Ti/Al (30/180 nm) electrode is formed at a predetermined position on the surface of the second electron supply layer 107 by a vapor deposition/lift-off method using a photoresist mask having an opening pattern in a region in which the source electrode 108 and the drain electrode 109 are formed. Then, rapid thermal annealing (RTA) is performed on the formed Ti/Al (30/180 nm) electrode at 700° C. for 60 seconds to obtain the source electrode 108 and the drain electrode 109.

Figure 4:
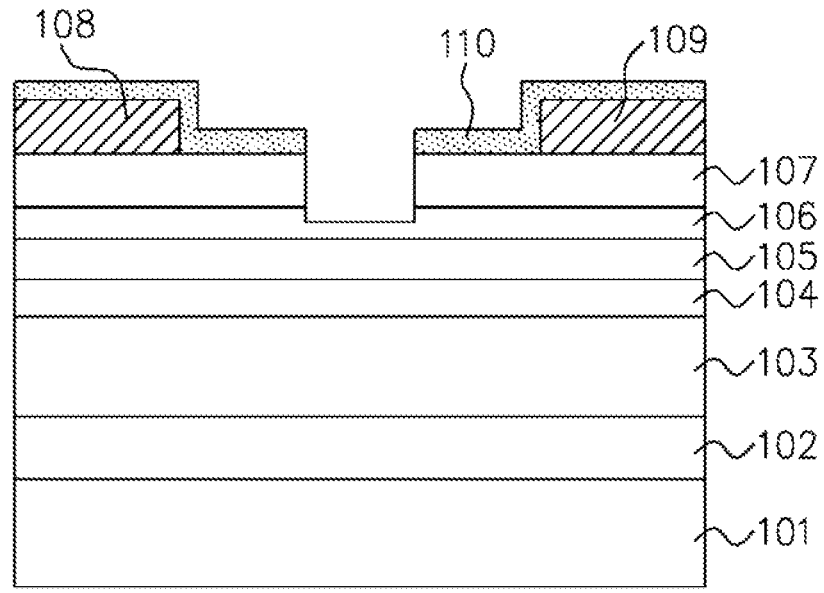
FIG. 4 is a cross-sectional view schematically illustrating an example of a process of forming a recess structure in the process of manufacturing the field effect transistor according to this embodiment.

As shown in FIG. 4, the protective film 110 made of SiN is formed with a thickness of 100 nm by a plasma chemical vapor deposition (CVD) method. Then, the protective film 110 is etched by a reactive ion etching (RIE) method using a photoresist mask having an opening pattern at a predetermined position between the source electrode 108 and the drain electrode 109. After the photoresist mask is removed, the entire second electron supply layer 107 and a portion of the threshold value control layer 106 are removed by an inductively coupled plasma (ICP) dry etching method using the protective film 110 as an etching mask, in a portion of the space between the source electrode 108 and the drain electrode 109.

Figure 5:
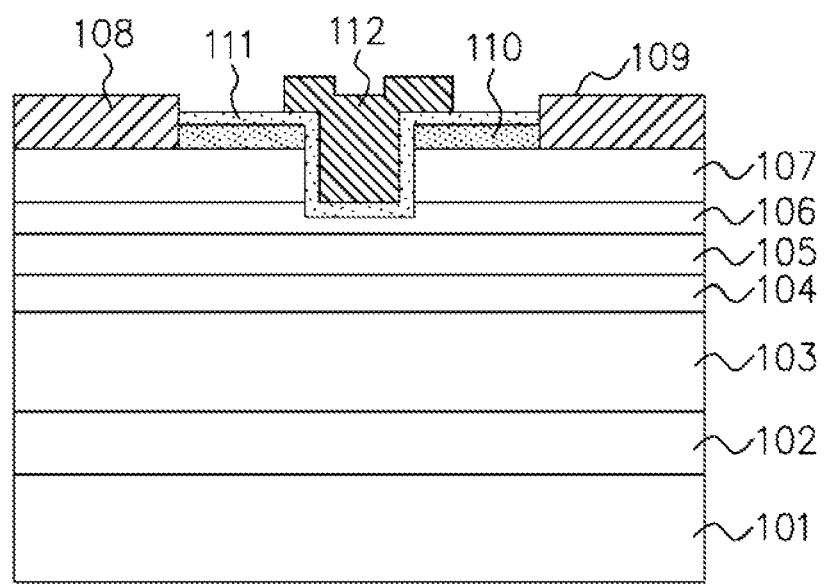
FIG. 5 is a cross-sectional view schematically illustrating an example of a process of forming a gate insulating film and a gate electrode in the process of manufacturing the field effect transistor according to this embodiment.

Then, as shown in FIG. 5, the gate insulating film 111 is made of $Al_2O_3$ with a thickness of 30 nm by an atomic layer deposition (ALD) method. Then, Ni/Au (30/300 nm) is formed at a predetermined position by a vapor deposition/lift-off method using a photoresist mask having an opening pattern in a region in which the gate electrode 112 is formed, thereby obtaining the gate electrode 112. Finally, the gate insulating film 111 and the protective film 110 are removed by the reactive ion etching (RIE) method using a photoresist mask having an opening pattern in a region in which the source electrode 108 and the drain electrode 109 are formed. In this way, the field effect transistor is completed.

Figure 6:
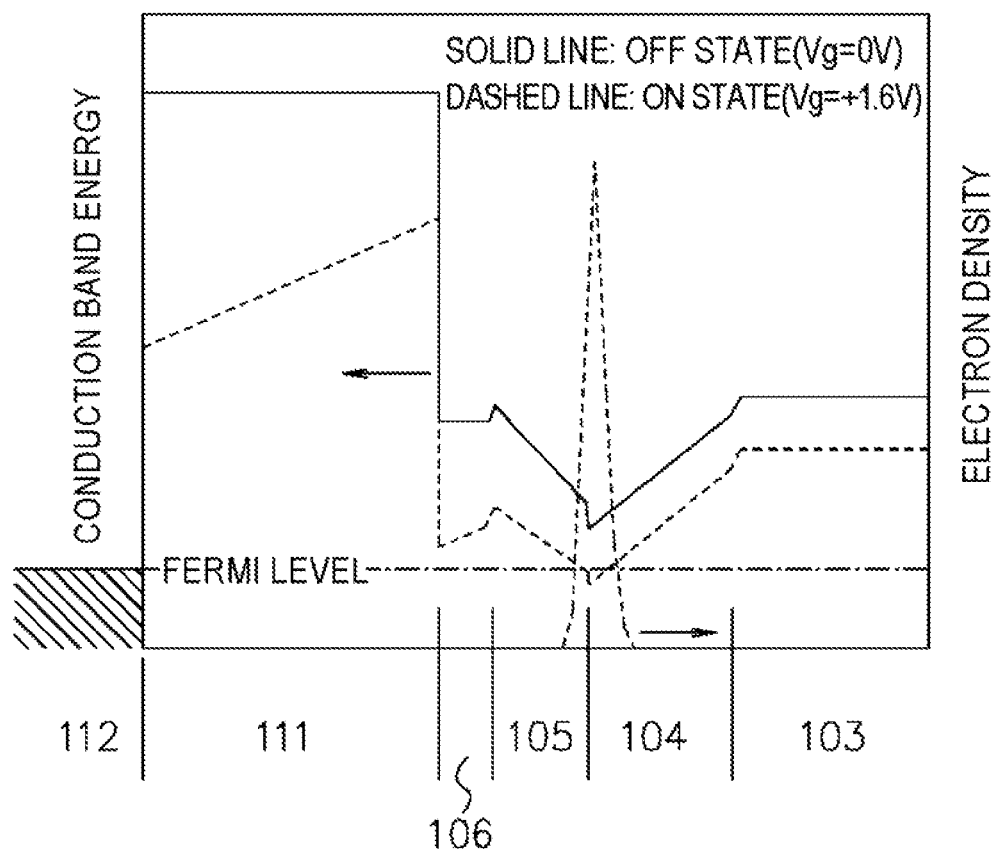
FIG. 6 is a diagram illustrating the distribution of conduction band energy and electron density below the gate electrode in the on and off states of the field effect transistor according to this embodiment.

An example of the operation of the field effect transistor according to this embodiment will be described below with reference to FIGS. 6 to 9. FIG. 6 shows a conduction band energy distribution and an electron density distribution in the cross section in a direction vertical to the surface of a wafer, in the vicinity of the center of the region in which the gate electrode 112 is formed in FIG. 1. In FIG. 6, a solid line indicates a distribution when no bias voltage (Vg=0 V) is applied to the gate electrode 112 and a dashed line indicates a distribution when a positive bias voltage (Vg=+1.6 V) higher than a predetermined threshold voltage (Vt) is applied to the gate electrode 112.

As shown in FIG. 6, when no bias voltage (Vg=0 V) is applied to the gate electrode 112, the conduction band energy is not lower than a Fermi level in the range from the gate insulating film 111 on the surface to the base layer 103 in the conduction band energy distribution. That is, an electron serving as a carrier is not stored in any layer. In other words, in the field effect transistor shown in FIG. 1, when the positive bias voltage Vg is 0 V, the region in which the source electrode 108 is formed and the region in which the drain electrode 109 is formed are electrically isolated from each other below the gate electrode 112. In this way, the field effect transistor becomes an off state in which no current flows between the source electrode 108 and the drain electrode 109.

On the other hand, when a positive bias voltage (Vg>Vt>0 V) equal to or higher than the predetermined threshold voltage (Vt) is applied to the gate electrode 112, as shown in FIG. 6, the conduction band energy is reduced and is lower than the Fermi level in the vicinity of the interface between the channel layer 104 and the first electron supply layer 105. An electron serving as a carrier is stored as a two-dimensional electron gas in a portion of the interface close to the channel layer 104. That is, in the field effect transistor shown in FIG. 1, when a positive bias voltage (Vg>Vt>0 V) equal to or higher than the predetermined threshold voltage (Vt) is applied to the gate electrode 112, the two-dimensional electron gas generated in the channel layer 104 electrically connects the region in which the source electrode 108 is formed and the region in which the drain electrode 109 is formed. In this way, the field effect transistor becomes an on state in which a current flows between the source electrode 108 and the drain electrode 109.

As such, when no bias voltage is applied to the gate electrode 112 (Vg=0 V), the field effect transistor according to this embodiment becomes an off state in which no current flows between the source electrode 108 and the drain electrode 109. Only when a positive bias voltage (Vg>Vt>0 V) equal to or higher than the predetermined threshold voltage (Vt) is applied, the field effect transistor according to this embodiment becomes the on state. Therefore, the field effect transistor functions as a normally-off (enhancement) field effect transistor in which a current flows between the source electrode 108 and the drain electrode 109.

Figure 7:
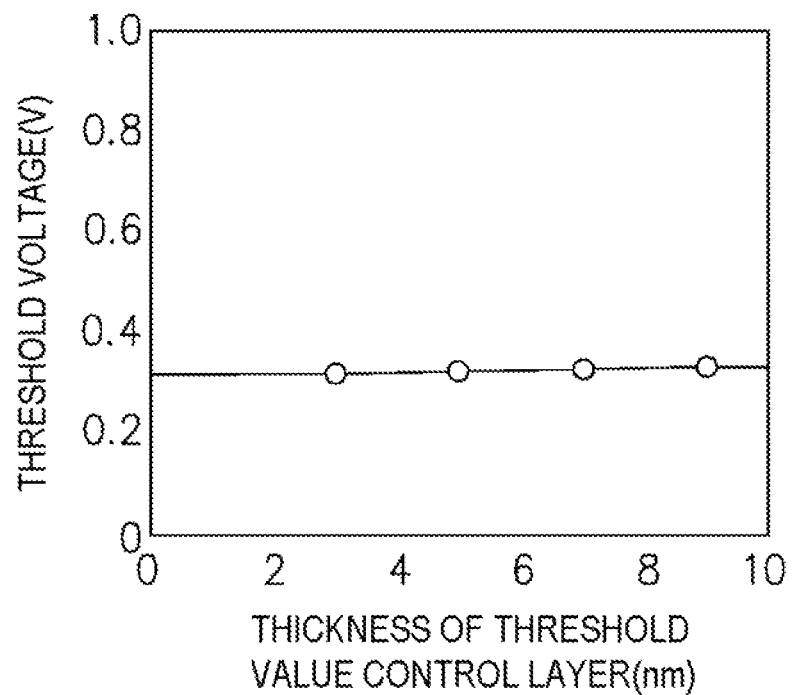
FIG. 7 is a characteristic diagram illustrating a variation in a threshold voltage with respect to a change in the thickness of a threshold value control layer in the field effect transistor according to this embodiment.

FIG. 7 shows a variation in the threshold voltage (Vt) when the thickness of the threshold value control layer 106 is changed in the field effect transistor according to this embodiment. As shown in FIG. 7, in the field effect transistor according to this embodiment, even when the thickness of the threshold value control layer 106 is changed, there is little variation in the threshold voltage (Vt). That is, in a case in which the recess structure is formed in the region in which the gate electrode 112 is formed, even when the thickness of the threshold value control layer 106 remaining in the recess structure is changed due to a variation in etching depth, the change of the thickness does not affect the threshold voltage (Vt) of the field effect transistor. This effect is obtained by forming the base layer 103 and the threshold value control layer 106 to have the same Al composition (X=Z). This is the difference between this embodiment and Patent Document 1 in which the carrier travel layer that generates an electron serving as a carrier and the threshold value control layer are made of the same material.

In order to obtain the above-mentioned effect, the bottom of the recess structure needs to be formed in the threshold value control layer 106, and a variation in the etching depth during dry etching is about 3 nm to 4 nm at most. That is, when the thickness of the threshold value control layer 106 is 10 nm as in this embodiment, it is possible to reliably form the bottom of the recess structure in the threshold value control layer 106.

As described above, in the field effect transistor according to this embodiment, the base layer 103 and the threshold value control layer 106 have the same Al composition (X=Z). Therefore, it is possible to significantly increase threshold value controllability.

Figure 8:
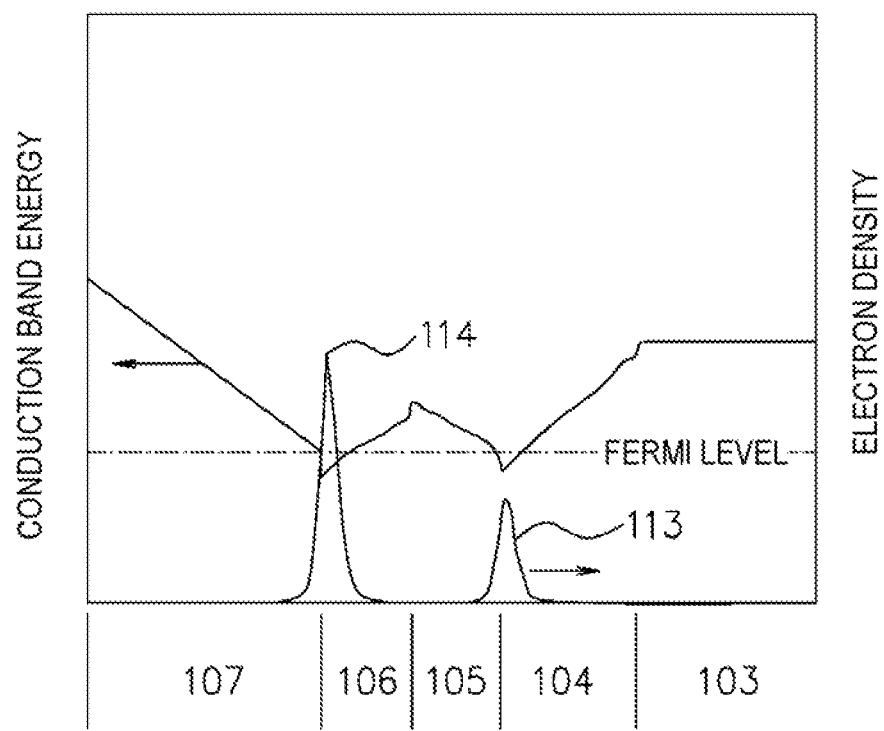
FIG. 8 is a diagram schematically illustrating an example of the distribution of conduction band energy and electron density in a region between the source electrode and the gate electrode in the field effect transistor according to this embodiment.

FIG. 8 shows the relationship between a conduction band energy distribution and an electron density distribution in the cross section in a direction vertical to the surface of a wafer, in the region between the source electrode 108 and the gate electrode 112 shown in FIG. 1. As shown in FIG. 8, the conduction band energy is less than the Fermi level in the vicinity of the interface between the second electron supply layer 107 and the threshold value control layer 106 and in the vicinity of the interface between the first electron supply layer 105 and the channel layer 104.

An electron serving as a carrier is stored as the two-dimensional electron gas 114 on the side of the threshold value control layer 106 at the interface between the second electron supply layer 107 and the threshold value control layer 106. In addition, an electron serving as a carrier is stored as, the two-dimensional electron gas 113 on the side of the channel layer 104 at the interface between the first electron supply layer 105 and the channel layer 104. In this way, a two-dimensional electron gas serving as a carrier is stored in two different layers, that is, the threshold value control layer 106 and the channel layer 104. Therefore, in order to achieve a field effect transistor with a low on-resistance, it is necessary to reduce the connection resistance between the two-dimensional electron gas 114 in the threshold value control layer 106 and the two-dimensional electron gas 113 in the channel layer 104.

Figure 9:
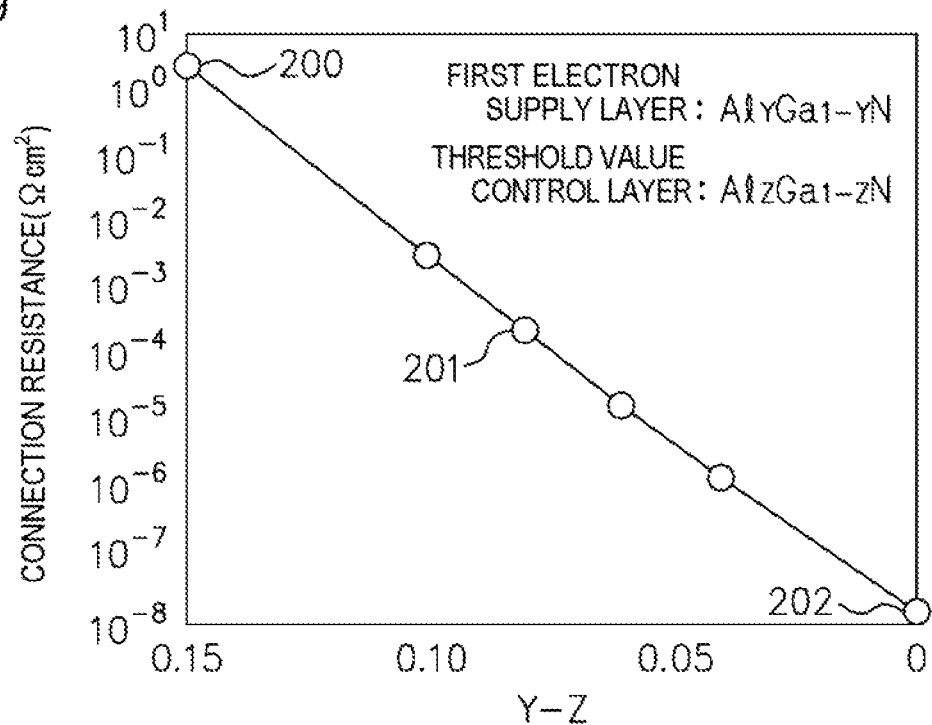
FIG. 9 is a characteristic diagram illustrating a variation in the connection resistance between a two-dimensional electron gas in the threshold value control layer and a two-dimensional electron gas in a channel layer when the difference between the Al composition of a first electron supply layer and the Al composition of the threshold value control layer is changed in the field effect transistor according to this embodiment.

FIG. 9 shows a variation in the connection resistance between the two-dimensional electron gas 114 in the threshold value control layer 106 and the two-dimensional electron gas 113 in the channel layer 104 when the difference (Y−Z) between the Al composition Y of the first electron supply layer 105 made of $Al_YGa_{1-Y}N$ and the Al composition Z of the threshold value control layer 106 made of $Al_ZGa_{1-Z}N$ is changed in the structure of the field effect transistor according to this embodiment. In this embodiment, since Y is 0.15 and Z is 0.07, the difference Y−Z is 0.08. As can be seen from FIG. 9, the connection resistance between the two-dimensional electron gas 114 in the threshold value control layer 106 and the two-dimensional electron gas 113 in the channel layer 104 is $10^{-4}$ $\Omega cm^2$ (see reference numeral 201 in FIG. 9).

When the Al composition Z of the threshold value control layer 106 is 0 and the Al composition X of the base layer 103 is 0, this corresponds to the structure disclosed in Patent Document 1 in which the threshold value control layer 106 and the base layer 103 are made of GaN, that is, the same material as that forming the channel layer 104. In this case, the difference Y−Z is 0.15. As can be seen from FIG. 9, the connection resistance between the two-dimensional electron gas 114 in the threshold value control layer 106 and the two-dimensional electron gas 113 in the channel layer 104 is $10^0$ $\Omega cm^2$ (see reference numeral 200 in FIG. 9). That is, in the field effect transistor disclosed in Patent Document 1, the connection resistance is four orders of magnitude more than that in the field effect transistor according to this embodiment.

As such, in the field effect transistor according to this embodiment, the Al composition Y of the first electron supply layer 105 and the Al composition Z of the threshold value control layer 106 are considered and the difference between the Al composition Y of the first electron supply layer 105 and the Al composition Z of the threshold value control layer 106 is reduced. In this way, it is possible to reduce the connection resistance between the two-dimensional electron gas 114 in the threshold value control layer 106 and the two-dimensional electron gas 113 in the channel layer 104. As a result, it is possible to achieve a normally-off field effect transistor with a low on-resistance.

As described above, according to this embodiment, it is possible to achieve a normally-off field effect transistor with very high threshold value controllability and a low on-resistance.

Second Embodiment

In the first embodiment, the connection resistance between the two-dimensional electron gas 114 in the threshold value control layer 106 and the two-dimensional electron gas 113 in the channel layer 104 is $10^{-4}$ $\Omega cm^2$ which is about one order of magnitude more than a connection resistance of $10^{-5}$ $\Omega cm^2$ between the source and drain electrodes 108 and 109 and the two-dimensional electron gas 114. In this embodiment, an example of a structure capable of further reducing the on-resistance will be described below.

For example, a field effect transistor according to this embodiment is different from that according to the first embodiment in that the threshold value control layer 106 is made of $Al_{0.15}Ga_{0.85}N$. In the field effect transistor according to this embodiment, the Al composition X of the base layer 103 made of $Al_XGa_{1-X}N$ is 0.07, the Al composition Y of the first electron supply layer 105 made of $Al_YGa_{1-Y}N$ is 0.15, the Al composition Z of the threshold value control layer 106 made of $Al_ZGa_{1-Z}N$ is 0.15, and the Al composition W of the second electron supply layer 107 made of $Al_WGa_{1-W}N$ is 0.25. The Al composition of each layer satisfies 0<X≤Y≤1 and 0<Z≤Y≤1. In addition, the Al composition of each layer satisfies Y−X≤0.1, Y−Z≤0.1, Z−X≤0.1, and Y≤W≤1. In this embodiment, Y=Z is established, that is, the first electron supply layer 105 and the threshold value control layer 106 have the same Al composition.

A method of manufacturing the field effect transistor according to this embodiment is different from the method of manufacturing the field effect transistor according to the first embodiment described with reference to FIGS. 2 to 5 in that the threshold value control layer 106 may be made of $Al_{0.15}Ga_{0.85}N$ when the laminated structure of a nitride semiconductor is formed by metal organic vapor phase epitaxy (MOVPE). The other processes may be the same as those in the method of manufacturing the field effect transistor according to the first embodiment.

Next, an example of the operation of the field effect transistor according to this embodiment will be described with reference to FIGS. 9 to 11. As described above, FIG. 9 shows a variation in the connection resistance between the two-dimensional electron gas 114 in the threshold value control layer 106 and the two-dimensional electron gas 113 in the channel layer 104 when the difference (Y−Z) between the Al composition Y of the first electron supply layer 105 made of $Al_YGa_{1-Y}N$ and the Al composition Z of the threshold value control layer 106 made of $Al_ZGa_{1-Z}N$ is changed in the field effect transistor according to this embodiment.

In this embodiment, the Al composition Y of the first electron supply layer 105 is equal to the Al composition Z of the threshold value control layer 106, that is, the difference Y−Z is 0. As can be seen from FIG. 9, in this embodiment, the connection resistance between the two-dimensional electron gas 114 in the threshold value control layer 106 and the two-dimensional electron gas 113 in the channel layer 104 is $10^{-8}$ $\Omega cm^2$ (see reference numeral 202 in FIG. 9). This value is three orders of magnitude less than a connection resistance of $10^{-5}$ $\Omega cm^2$ between the source and drain electrodes 108 and 109 and the two-dimensional electron gas 114, and the contribution of the value to the on-resistance of the field effect transistor is negligibly small. It is possible to significantly reduce the connection resistance by making the Al composition Y of the first electron supply layer 105 equal to the Al composition Z of the threshold value control layer 106, that is, by setting the difference Y−Z to 0.

As such, in the field effect transistor according to this embodiment, it is possible to significantly reduce the connection resistance between the two-dimensional electron gas 114 in the threshold value control layer 106 and the two-dimensional electron gas 113 in the channel layer 104. As a result, it is possible to achieve a normally-off field effect transistor with a very low on-resistance.

Figure 10:
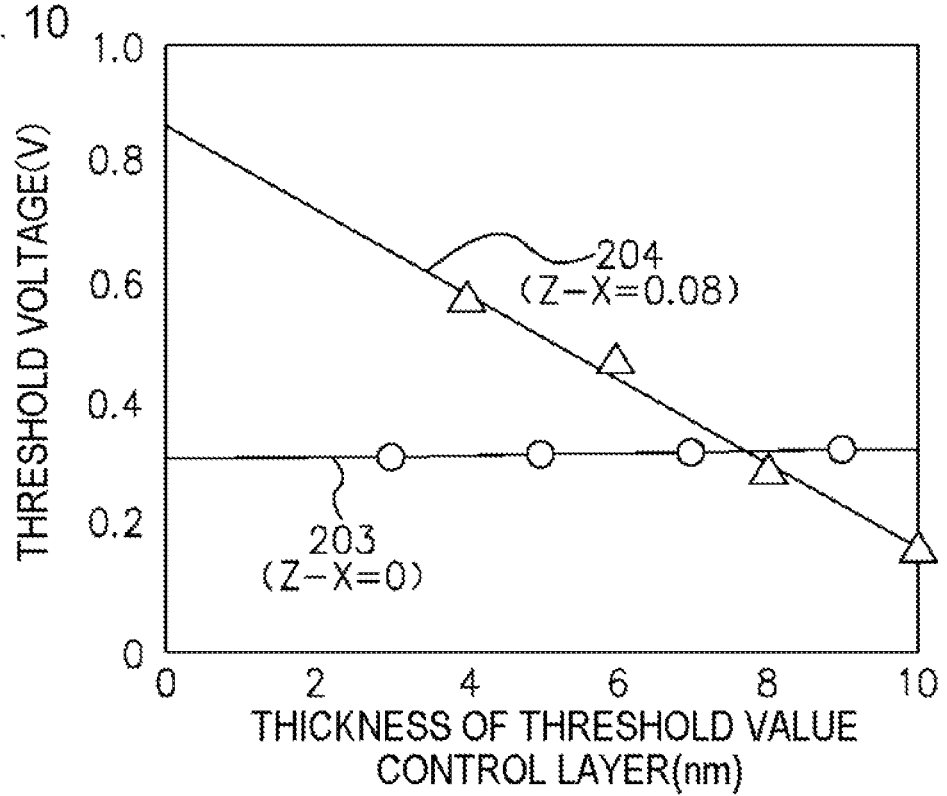
FIG. 10 is a characteristic diagram illustrating a variation in the threshold voltage with respect to a change in the thickness of the threshold value control layer in the field effect transistor according to this embodiment.
Figure 11:
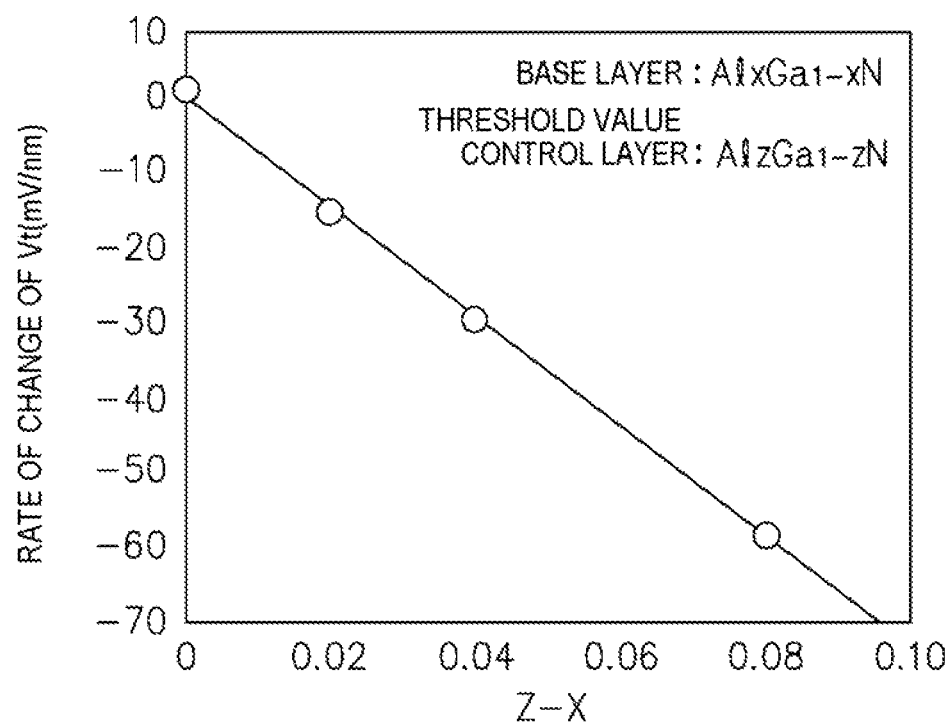
FIG. 11 is a characteristic diagram illustrating the rate of change of Vt when the difference between the Al composition of the threshold value control layer and the Al composition of the base layer is changed in the field effect transistor according to this embodiment.
Figure 12:
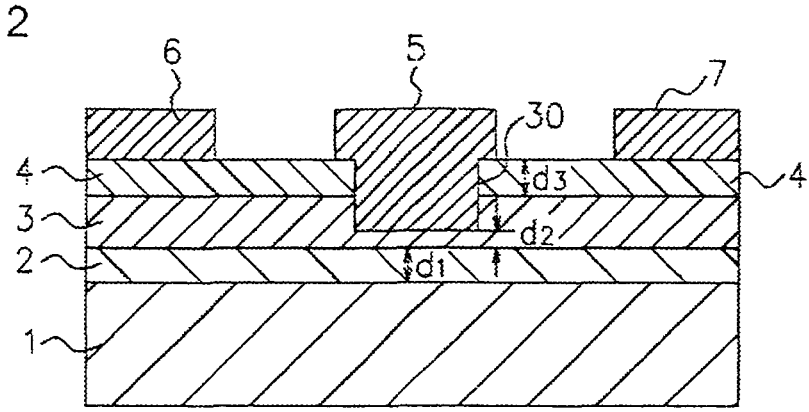
FIG. 12 is a cross-sectional view illustrating the structure of a normally-off (enhancement) field effect transistor disclosed in Patent Document 1.
Figure 13:
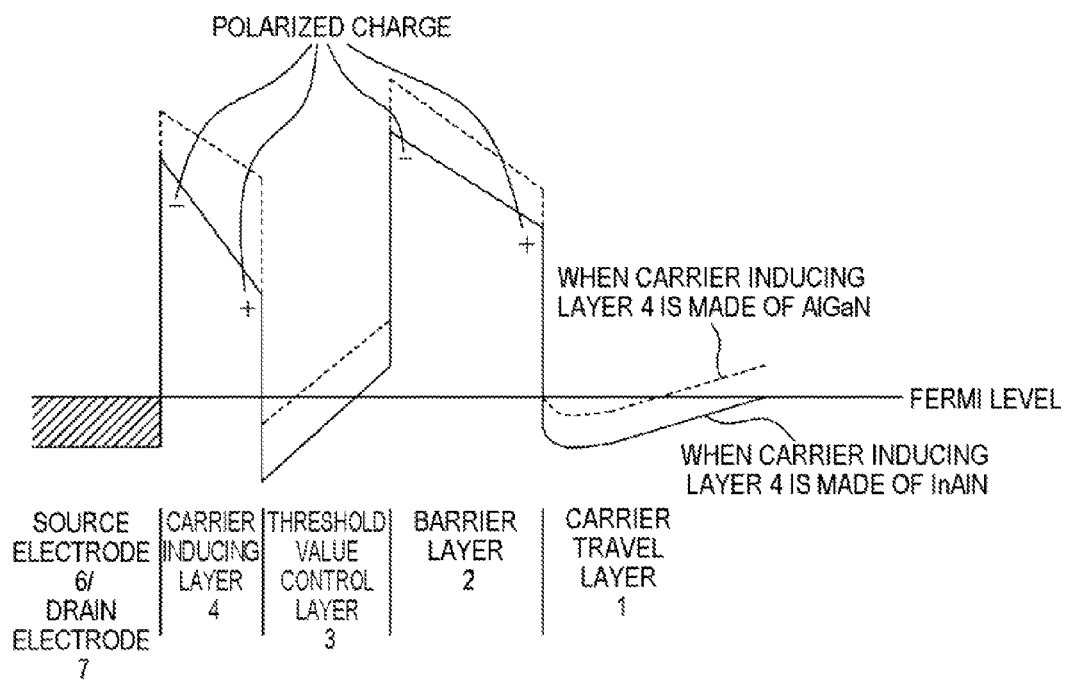
FIG. 13 is a diagram illustrating the distribution of conduction band energy in a region in which a source electrode and a drain electrode are formed in the field effect transistor disclosed in Patent Document 1.

FIG. 10 shows a variation in the threshold voltage (Vt) when the thickness of the threshold value control layer 106 is changed in the field effect transistor according to this embodiment. As shown in FIG. 10, in the field effect transistor according to this embodiment, the Al composition Z of the threshold value control layer 106 is different from the Al composition X of the base layer 103 (Z−X=0.08). Therefore, the variation in the threshold voltage (Vt) when the thickness of the threshold value control layer 106 is changed is more than that in the field effect transistor (see reference numeral 203 in FIG. 10) according to the first embodiment.

In the field effect transistor according to this embodiment, a variation in the threshold voltage (Vt) when the thickness of the threshold value control layer 106 is changed by 1 nm is defined as the rate of change of Vt. FIG. 11 is a characteristic diagram illustrating the rate of change of Vt when the difference (Z−X) between the Al composition Z of the threshold value control layer 106 and the Al composition X of the base layer 103 is changed.

In this embodiment, the Al composition Z of the threshold value control layer 106 is 0.15 and the Al composition X of the base layer 103 is 0.07. That is, in this embodiment, the difference Z−X is 0.08. As can be seen from FIG. 8, the rate of change of Vt is about 58 mV/nm. In the first embodiment, since the difference Z−X is 0, the rate of change of Vt is almost 0 mV/nm. Therefore, the threshold value controllability of the field effect transistor according to this embodiment is less than that of the field effect transistor according to the first embodiment. However, as disclosed in Patent Document 1, for example, since the rate of change of Vt is several hundreds of mV/nm in the field effect transistor having the structure in which the bottom of the recess structure is formed in the first electron supply layer, the field effect transistor according to this embodiment has relatively high threshold value controllability.

As described above, according to this embodiment, the Al composition Y of the first electron supply layer and the Al composition Z of the threshold value control layer are considered and the difference (Y−Z) between the Al composition Y of the first electron supply layer and the Al composition Z of the threshold value control layer is reduced. In this way, it is possible to achieve a normally-off field effect transistor with a very small on-resistance and relatively high threshold value controllability.

Third Embodiment

In the first and second embodiments, the tradeoff relationship is established between the threshold value controllability and the on-resistance. That is, when the threshold value controllability is improved, the on-resistance increases. When the on-resistance is reduced, the threshold value controllability is reduced. In this embodiment, an example of a structure capable of obtaining high threshold value controllability and a low on-resistance will be described.

For example, a field effect transistor according to this embodiment is different from that according to the first embodiment in that the base layer 103 is made of $Al_{0.09}Ga_{0.91}N$ and the threshold value control layer 106 is made of $Al_{0.12}Ga_{0.88}N$. In the field effect transistor according to this embodiment, the Al composition X of the base layer 103 made of $Al_XGa_{1-X}N$ is 0.09, the Al composition Y of the first electron supply layer 105 made of $Al_YGa_{1-Y}N$ is 0.15, the Al composition Z of the threshold value control layer 106 made of $Al_ZGa_{1-Z}N$ is 0.12, and the Al composition W of the second electron supply layer 107 made of $Al_WGa_{1-W}N$ is 0.25. The Al composition of each layer satisfies $0<X \leq Y \leq 1$ and $0<Z \leq Y \leq 1$. In addition, the Al composition of each layer satisfies $Y-X \leq 0.1$, $Y-Z \leq 0.1$, $Z-X \leq 0.1$, and $Y \leq W \leq 1$. In particular, in this embodiment, $Y-Z \leq 0.03$ and $Z-X \leq 0.03$ are satisfied. The ranges $Y-Z \leq 0.03$ and $Z-X \leq 0.03$ are based on the description in FIGS. 9 and 11.

A method of manufacturing the field effect transistor according to this embodiment is different from the method of manufacturing the field effect transistor according to the first embodiment shown in FIGS. 2 to 5 in that the base layer 103 is made of $Al_{0.09}Ga_{0.91}N$ and the threshold value control layer 106 is $Al_{0.12}Ga_{0.88}N$ when the laminated structure of a nitride semiconductor is obtained by metal organic vapor phase epitaxy (MOVPE). The other processes are the same as those in the method of manufacturing the field effect transistor according to the first embodiment.

Next, an example of the operation of the field effect transistor according to this embodiment will be described with reference to FIGS. 9 and 11. As described above, FIG. 9 shows a variation in the connection resistance between the two-dimensional electron gas 114 in the threshold value control layer 106 and the two-dimensional electron gas 113 in the channel layer 104 when the difference (Y−Z) between the Al composition Y of the first electron supply layer 105 made of $Al_YGa_{1-Y}N$ and the Al composition Z of the threshold value control layer 106 made of $Al_ZGa_{1-Z}N$ is changed in the field effect transistor according to this embodiment.

In this embodiment, the Al composition Y of the first electron supply layer 105 is 0.15 and the Al composition Z of the threshold value control layer 106 is 0.12. That is, the difference Y−Z is 0.03. As can be seen from FIG. 9, the connection resistance between the two-dimensional electron gas 114 in the threshold value control layer 106 and the two-dimensional electron gas 113 in the channel layer 104 is $10^{-7}$ $\Omega\text{cm}^2$. This value is two orders of magnitude less than a connection resistance of $10^{-5}$ $\Omega\text{cm}^2$ between the source electrode 108 and the drain electrode 109, and the two-dimensional electron gas 114, and the contribution of the value to the on-resistance of the field effect transistor is negligibly small. It is possible to reduce the connection resistance by reducing the difference (Y−Z) between the Al composition Y of the first electron supply layer 105 and the Al composition Z of the threshold value control layer 106, specifically, by reducing the difference Y−Z to be equal to or less than 0.03.

As such, in the field effect transistor according to the this embodiment, it is possible to reduce the connection resistance between the two-dimensional electron gas 114 in the threshold value control layer 106 and the two-dimensional electron gas 113 in the channel layer 104. As a result, it is possible to achieve a normally-off field effect transistor with a very small on-resistance.

As described above, in the field effect transistor according to this embodiment, a variation in the threshold voltage (Vt) when the thickness of the threshold value control layer 106 is changed by 1 nm is defined as the rate of change of Vt. FIG. 11 is a characteristic diagram illustrating the rate of change of Vt when the difference (Z−X) between the Al composition Z of the threshold value control layer 106 and the Al composition X of the base layer 103 is changed.

In this embodiment, the Al composition Z of the threshold value control layer 106 is 0.12 and the Al composition X of the base layer 103 is 0.09. That is, in this embodiment, the difference Z−X is 0.03. As can be seen from FIG. 11, the rate of change of Vt is about 21 mV/nm. That is, in this embodiment, it is possible to reduce a variation in the threshold voltage to about one-third of the rate of change of Vt, 58 mV/nm, in the second embodiment. It is possible to reduce the rate of change of Vt by reducing the difference (Z−X) between the Al composition Z of the threshold value control layer 106 and the Al composition X of the base layer 103, specifically, by reducing the difference Z−X to be equal to or less than 0.03. As such, the field effect transistor according to this embodiment is a normally-off field effect transistor with very high threshold value controllability.

As described above, in this embodiment, the Al composition X of the base layer, the Al composition Y of the first electron supply layer, and the Al composition Z of the threshold value control layer are considered and the differences (Y−Z) and (Z−X) are set so as to satisfy Y−Z≤0.03 and Z−X≤0.03. Therefore, it is possible to achieve a normally-off field effect transistor with both a very small on-resistance and very high threshold value controllability.

Fourth Embodiment

In the third embodiment, it is possible to improve both a small on-resistance and high threshold value controllability. It is also possible to further improve the on-resistance and the threshold value controllability. In this embodiment, an example of a structure capable of further improving the on-resistance and the threshold value controllability will be described below.

A field effect transistor according to this embodiment is different from that according to the first embodiment in that, for example, the base layer 103 is made of $Al_{0.15}Ga_{0.85}N$ and the threshold value control layer 106 is made of $Al_{0.15}Ga_{0.85}N$. In the field effect transistor according to this embodiment, the Al composition X of the base layer 103 made of $Al_XGa_{1-X}N$ is 0.15, the Al composition Y of the first electron supply layer 105 made of $Al_YGa_{1-Y}N$ is 0.15, the Al composition Z of the threshold value control layer 106 made of $Al_ZGa_{1-Z}N$ is 0.15, and the Al composition W of the second electron supply layer 107 made of $Al_WGa_{1-W}N$ is 0.25. The Al composition of each of the above-mentioned layers satisfies 0<X≤Y≤1 and 0<Z≤Y≤1. In addition, the Al composition of each of the above-mentioned layers satisfies Y−X≤0.1, Y−Z≤0.1, Z−X≤0.1, and Y≤W≤1. In particular, in this embodiment, X=Y=Z is established.

A method of manufacturing the field effect transistor according to this embodiment is different from the method of manufacturing the field effect transistor according to the first embodiment shown in FIGS. 2 to 5 in that the base layer 103 is made of $Al_{0.15}Ga_{0.85}N$ and the threshold value control layer 106 is $Al_{0.15}Ga_{0.85}N$ when the laminated structure of a nitride semiconductor is obtained by metal organic vapor phase epitaxy (MOVPE). The other processes are the same as those in the method of manufacturing the field effect transistor according to the first embodiment.

Next, an example of the operation of the field effect transistor according to this embodiment will be described with reference to FIGS. 9 and 11. As described above, FIG. 9 shows a variation in the connection resistance between the two-dimensional electron gas 114 in the threshold value control layer 106 and the two-dimensional electron gas 113 in the channel layer 104 when the difference (Y−Z) between the Al composition Y of the first electron supply layer 105 made of $Al_YGa_{1-Y}N$ and the Al composition Z of the threshold value control layer 106 made of $Al_ZGa_{1-Z}N$ is changed in the field effect transistor according to this embodiment.

In this embodiment, the Al composition Y of the first electron supply layer 105 is the same as the Al composition Z of the threshold value control layer 106. That is, in this embodiment, the difference Y−Z is 0. As can be seen from FIG. 9, the connection resistance between the two-dimensional electron gas 114 in the threshold value control layer 106 and the two-dimensional electron gas 113 in the channel layer 104 is $10^{-8}$ $\Omega\text{cm}^2$. This value is three orders of magnitude less than a connection resistance of $10^{-5}$ $\Omega\text{cm}^2$ between the source and drain electrodes 108 and 109 and the two-dimensional electron gas 114, and the contribution of the value to the on-resistance of the field effect transistor is negligibly small. It is possible to significantly reduce the connection resistance by making the Al composition Y of the first electron supply layer 105 equal to the Al composition Z of the threshold value control layer 106, that is, by setting the difference Y−Z to 0.

As such, in the field effect transistor according to this embodiment, it is possible to significantly reduce the connection resistance between the two-dimensional electron gas 114 in the threshold value control layer 106 and the two-dimensional electron gas 113 in the channel layer 104. As a result, it is possible to achieve a normally-off field effect transistor with a very small on-resistance.

As described above, in the field effect transistor according to this embodiment, a variation in the threshold voltage (Vt) when the thickness of the threshold value control layer 106 is changed by 1 nm is defined as the rate of change of Vt. FIG. 11 is a characteristic diagram illustrating the rate of change of Vt when the difference (Z−X) between the Al composition Z of the threshold value control layer 106 and the Al composition X of the base layer 103 is changed.

In this embodiment, the Al composition Z of the threshold value control layer 106 is the same as the Al composition X of the base layer 103. That is, in this embodiment, the difference Z–X is 0. As can be seen from FIG. 11, the rate of change of Vt is almost 0 mV/nm. It is possible to significantly reduce the rate of change of Vt by making the Al composition Z of the threshold value control layer 106 equal to the Al composition X of the base layer 103, that is, by setting the difference Z–X to 0. As such, the field effect transistor according to this embodiment is a normally-off field effect transistor with very high threshold value controllability.

As described above, in this embodiment, the Al composition X of the base layer, the Al composition Y of the first electron supply layer, and the Al composition Z of the threshold value control layer are considered and the Al compositions X, Y, and Z are equal to one another. Therefore, it is possible to achieve a normally-off field effect transistor with both a very small on-resistance and very high threshold value controllability.

In order to describe the field effect transistors according to exemplary embodiments of the invention, four exemplary embodiments have been described above. The materials or the manufacturing processes described in the above-described embodiments are illustrative, and the invention is not limited thereto.

For example, the substrate 101 is not limited to the SiC substrate, but any substrate may be used as long as it can epitaxially grow a nitride-based semiconductor. For example, a sapphire substrate, a GaN substrate, a Si substrate, or a SOI substrate may be used. The gate insulating film 111 is not limited to the $Al_2O_3$ film, but a $SiO_2$ film, a SiN film, a SiON film, an AlN film, a MgO film, a $Sc_2O_3$ film, a $ZrO_2$ film, a $HfO_2$ film, or a laminated structure of these films may be used as the gate insulating film 111. In addition, a Schottky junction gate in which the gate insulating film 111 is removed and the gate electrode 112 is directly formed in the recess structure may be used.

In the laminated structure of the nitride semiconductor obtained by epitaxial growth, the base layer, the channel layer, the first electron supply layer, the threshold value control layer, and the second electron supply layer satisfying at least $0<X\leq Y\leq 1$ and $0<Z\leq Y\leq 1$ may be laminated in this order. In addition, the laminated structure of the nitride semiconductor may satisfy at least one of $Y-X\leq 0.1$, $Y-Z\leq 0.1$, $Z-X\leq 0.1$, and $Y\leq W\leq 1$.

For example, the laminated structure of the nitride semiconductor may further include a cap layer. When a cap layer made of a nitride-based semiconductor is provided on the second electron supply layer, it is possible to stabilize the surface and reduce gate leakage and contact resistance. As such, it is possible to combine various kinds of layers without damaging the effect of the invention.

In the above-described embodiments, the channel layer is made of GaN, the first electron supply layer is made of $Al_{0.15}Ga_{0.85}N$ and the second electron supply layer is made of $Al_{0.25}Ga_{0.75}N$. However, the materials and Al compositions of these layers are limited to the above. For example, the channel layer may be made of InGaN and the Al compositions of the first and second electron supply layers may be different from those according to the above-described embodiments. In addition, in the entire laminated structure of the nitride semiconductor, the thickness of each layer is not limited to that described in the above-described embodiments, but n-type or p-type impurities may be implanted into an appropriate layer or a portion of the layer.

In this embodiment, when the Al compositions of the base layer made of $Al_XGa_{1-X}N$, the first electron supply layer made of $Al_YGa_{1-Y}N$, and the threshold value control layer made of $Al_ZGa_{1-Z}N$ satisfy $Y-Z\leq 0.1$, the value (Y–Z) is sufficiently small. That is, since the difference between the Al composition of the first electron supply layer and the Al composition of the threshold value control layer is a small value of 0.1 or less, an energy barrier generated by a negative polarized charge and a discontinuous conduction band at the interface between the layers is reduced. Therefore, it is possible to reduce the connection resistance between the two-dimensional electron gas in the threshold value control layer and the two-dimensional electron gas in the channel layer. As a result, it is possible to reduce the on-resistance of a normally-off field effect transistor and thus reduce power consumption.

In this embodiment, when the Al composition of the base layer made of $Al_XGa_{1-X}N$, the Al composition of the first electron supply layer made of $Al_YGa_{1-Y}N$, and the Al composition of the threshold value control layer made of $Al_ZGa_{1-Z}N$ satisfy $Z-X\leq 0.1$, the value (Z–X) is sufficiently small. That is, since the difference between the Al composition of the base layer and the Al composition of the threshold value control layer is a small value of 0.1 or less, it is possible to reduce the rate of change of the threshold voltage (Vt) with respect to the thickness of the threshold value control layer to be equal to or less than several tens of mV/nm. Therefore, in the normally-off field effect transistor, it is possible to prevent a variation in the threshold voltage (Vt) due to a variation in recess etching depth and improve threshold value controllability. In this way, it is possible to manufacture the field effect transistor with high yield.

In this embodiment, the layers forming the laminated structure of the nitride semiconductor are made of different materials. For example, the base layer and the threshold value control layer are made of AlGaN and the channel layer is made of GaN or InGaN. Therefore, as described above, in order to reduce the on-resistance and improve threshold value controllability, the difference Y–Z or Z–X is reduced, that is, the Al compositions of the base layer and the threshold value control layer increase to be close to the Al composition of the first electron supply layer. In this case, since the channel layer is made of GaN or InGaN with high mobility, it is possible to prevent an increase in channel resistance. Therefore, in a normally-off field effect transistor, it is possible to reduce the on-resistance and improve the threshold value controllability.

FIGS. 6 to 11 show computer simulation results. In FIG. 6 or FIGS. 9 to 11, a symbol "o" or "Δ" indicates a corresponding point in the first to fourth embodiments or Patent Document 1, that is, a representative point. However, the symbol is not limited to the point.

The exemplary embodiments of the invention have been described above, but the invention is not limited to the field effect transistors and the methods for manufacturing the field effect transistor according to the above-described embodiments. Various modifications and changes of the invention can be made without departing from the scope and spirit of the invention.

This application claims the priority based on Japanese Patent Application No. 2009-032715 filed Feb. 16, 2009, details of which are incorporated herein by reference.

INDUSTRIAL APPLICABILITY

The normally-off (enhancement) field effect transistor using the nitride semiconductor according to the invention has a structure that has a low on-resistance and is capable of reducing power consumption. Therefore, the normally-off field effect transistor can be applied to a transistor of a high-power microwave amplifier used in, for example, a base station of a mobile telephone terminal or a satellite communication system, or a transistor used in a power supply of a personal computer (PC) or a power control device of a power steering system of a vehicle, using the above-mentioned advantage.

The invention claimed is:

1. A field effect transistor comprising:
a nitride-based semiconductor multi-layer structure;
a source electrode;
a drain electrode;
a protective film; and
a gate electrode,
wherein the nitride-based semiconductor multi-layer structure includes at least a base layer made of $Al_XGa_{1-X}N$ ($0 \leq x \leq 1$), a channel layer made of GaN or InGaN, a first electron supply layer, which is an undoped or n-type $Al_yGa_{1-y}N$ layer, a threshold value control layer, which is an undoped $Al_ZGa_{1-Z}N$ layer, and a second electron supply layer, which is an undoped or n-type $Al_wGa_{1-w}N$ layer, epitaxially grown in this order over a substrate with a buffer layer interposed therebetween,
the source electrode, the drain electrode, and the protective film are provided over a surface of the nitride-based semiconductor multi-layer structure, the gate electrode is provided in a recess structure, which is formed by etching the entire protective film, the entire second electron supply layer, and a portion of the threshold value control layer in a portion of a space between the source electrode and the drain electrode, directly or with a gate insulating film interposed therebetween, and the Al composition of each layer in the nitride-based semiconductor multi-layer structure satisfies $0 \leq X \leq Y < 1$ and $0 < Z \leq Y \leq 1$.

2. The field effect transistor according to claim 1, wherein the Al composition of each layer in the nitride-based semiconductor multi-layer structure further satisfies $Y-X<0.1$.

3. The field effect transistor according to claim 1, wherein the Al composition of each layer in the nitride-based semiconductor multi-layer structure further satisfies $Y-Z<0.1$.

4. The field effect transistor according to claim 1, wherein the Al composition of each layer in the nitride-based semiconductor multi-layer structure further satisfies $Z-X<0.1$.

5. The field effect transistor according to claim 1, wherein the first electron supply layer has a thickness equal to or more than 2 nm and equal to or less than 15 nm, and the threshold value control layer has a thickness equal to or more than 2 nm and equal to or less than 15 nm.

6. The field effect transistor according to claim 1, wherein a difference between the Al composition Z of the threshold value control layer and the Al composition X of the base layer satisfies $Z-X<0.03$, and a difference between the Al composition Y of the first electron supply layer and the Al composition Z of the threshold value control layer satisfies $Y-Z<0.03$.

7. The field effect transistor according to claim 1, wherein the Al composition Z of the threshold value control layer is equal to the Al composition X of the base layer.

8. The field effect transistor according to claim 1, wherein the Al composition Y of the first electron supply layer is equal to the Al composition Z of the threshold value control layer.

9. The field effect transistor according to claim 1, wherein the Al composition Y of the first electron supply layer and the Al composition W of the second electron supply layer satisfy $Y \leq W \leq 1$.

10. The field effect transistor according to claim 1, wherein the nitride-based semiconductor multi-layer structure further includes a cap layer that is made of a nitride-based semiconductor and is provided over the second electron supply layer.

* * * * *